US006541836B2

(12) United States Patent
Iwanczyk et al.

(10) Patent No.: US 6,541,836 B2
(45) Date of Patent: Apr. 1, 2003

(54) SEMICONDUCTOR RADIATION DETECTOR WITH INTERNAL GAIN

(75) Inventors: Jan Iwanczyk, Los Angeles, CA (US); Bradley E. Patt, Sherman Oaks, CA (US); Gintas Vilkelis, Westlake Village, CA (US)

(73) Assignee: Photon Imaging, Inc., Northridge, CA (US)

( * ) Notice: Subject to any disclaimer, the term of this patent is extended or adjusted under 35 U.S.C. 154(b) by 58 days.

(21) Appl. No.: 09/835,829

(22) Filed: Apr. 16, 2001

(65) Prior Publication Data

US 2002/0139970 A1 Oct. 3, 2002

Related U.S. Application Data

(60) Provisional application No. 60/270,350, filed on Feb. 21, 2001.

(51) Int. Cl.$^7$ ............................................. H01L 31/115
(52) U.S. Cl. ....................................... 257/429; 257/438
(58) Field of Search ....................... 257/21, 414, 428, 257/429, 430, 438; 438/56

(56) References Cited

U.S. PATENT DOCUMENTS

| 4,885,620 A | * | 12/1989 | Kemmer et al. | ....... 514/252.14 |
| 5,121,181 A | * | 6/1992 | Smith et al. | .................. 257/21 |
| 5,146,296 A | * | 9/1992 | Huth | .......................... 257/429 |

OTHER PUBLICATIONS

Iwanczyk, J.S., et al., "Large Area Silicon Drift Detectors For X–Rays –New Results," IEEE Transactions on Nuclear Science, vol. 46 No. 3, pp. 284–288, Jun. 1999.

Iwanczyk, Jan S., et al. "Electronics for X–Ray and Gamma Ray Spectrometers," Semiconductors for Room Temperature Nuclear Detector Applications: Semiconductors and Semimetals, vol. 43, Chapter 14, Academic Press, San Diego, Boston, New York, London, Sydney, Tokyo and Toronto, pp. 531–560, 1995.

Anger, Hal O., "Scintillation Camera," The Review of Scientific Instruments, Vol. 29, No. 1,2 Pages., Jan. 1958.

Sze, S.M., "Physics of Semiconductor Devices," Chapter 13.4 Avalanche Photodiode, $2^{nd}$ Edition, Wile, John & Sons, Incorporated, pp. 766–783, Jan. 1991.

* cited by examiner

Primary Examiner—Carl Whitehead, Jr.
Assistant Examiner—William C. Vesperman
(74) Attorney, Agent, or Firm—Christie, Parker & Hale, LLP

(57) ABSTRACT

An avalanche drift photodetector (ADP) incorporates extremely low capacitance of a silicon drift photodetector (SDP) and internal gain that mitigates the surface leakage current noise of an avalanche photodetector (APD). The ADP can be coupled with scintillators such as CsI(Tl), NaI(Tl), LSO or others to form large volume scintillation type gamma ray detectors for gamma ray spectroscopy, photon counting, gamma ray counting, etc. Arrays of the ADPs can be used to replace the photomultiplier tubes (PMTs) used in conjunction with scintillation crystals in conventional gamma cameras for nuclear medical imaging.

33 Claims, 12 Drawing Sheets

SEMICONDUCTOR RADIATION DETECTOR WITH INTERNAL GAIN

CROSS-REFERENCE TO RELATED APPLICATION

The present application claims the priority of U.S. Provisional Application No. 60/270,350 entitled "Semiconductor Radiation Detector with Internal Gain" filed Feb. 21, 2001, the contents of which are fully incorporated by reference herein.

STATEMENT REGARDING FEDERALLY SPONSORED RESEARCH OR DEVELOPMENT

This invention was made with government. support under Small Business Innovation Research program (Grant #DE-FG03-99ER82853) awarded by the Department of Energy. The Government has certain rights in this invention.

FIELD OF THE INVENTION

The present invention is related to detection of radiation, and particularly, to a semiconductor radiation detector having internal gain.

BACKGROUND OF THE INVENTION

Gamma ray spectroscopy using scintillation detectors typically employs scintillators coupled to photomultiplier tubes (PMTs). Scintillator/PMT systems offer excellent efficiency with moderate energy resolution. These systems have drawbacks, however, particularly regarding the PMT light sensor. The PMT is a bulky and fragile component. It is vulnerable to damage, has low and non-uniform quantum efficiency, requires a stabilized high voltage for operation, and lacks immunity from magnetic fields. Consequently, it has been an ongoing quest to find suitable alternatives to replace either the PMT, or the entire scintillator/PMT system, for gamma-ray spectrometry. Such detectors are needed for applications such as gamma ray spectroscopy, photon counting, gamma ray counting, and gamma ray imaging.

Gamma ray imaging systems employ a large number of PMTs coupled to one or more scintillators. FIG. 1 shows a schematic diagram (right) of a conventional PMT-based gamma camera 100. The PMT-based gamma camera 100 includes a parallel-hole collimator 104, a scintillation crystal (typically CsI[Tl] or NaI[Tl]) 106, a light diffuser 108, an array of photomultiplier tubes (PMTs) 112, and a position/pulse-height module 114 which performs position arithmetic and spectrometric functions, all enclosed by a lead shield 102. This system has been largely unchanged since it was first described by Hal Anger in the 1950's. The position/pulse-height module 114 may include analog electronics and may also include one or more analog-to-digital converters (ADCs) for ADC conversion of analog signals at the front end.

Recently there has been an intensive effort by several groups to develop solid state photodetector-based gamma cameras based on scintillators coupled to silicon-PIN (Si-PIN) photodetectors, Si avalanche photodetectors (APDs), and Si drift photodetectors (SDPs), and non-scintillation cameras based on direct conversion of gamma rays in high-Z compound semiconductors such as cadmium zinc telluride (CZT) and mercuric iodide.

FIG. 1 also shows a schematic diagram (left) of a solid state photodetector-based gamma camera 120. The solid state photodetector-based gamma camera 120 includes a parallel-hole collimator 124, a scintillation crystal (typically CsI[Tl] or NaI[TL]) 126, a light diffuser 128, solid state photodetectors 132 on substrate 134, and a position/pulse-height module 136, all enclosed by a lead shield 122. The solid state photodetector-based gamma camera 120 may also be referred to as a solid state gamma camera.

Solid state gamma cameras have drawn a lot of interest because they may offer potential improvements in performance. Since the energy resolution of scintillation spectrometers depends primarily on the number of scintillation photons collected, the high quantum efficiency, high response uniformity, and low electronic noise of the solid state detectors should provide better energy resolution than current technologies.

In addition, because the spatial resolution of an Anger type scintillation camera typically depends on the spacing between the photodetectors and the signal-to-noise ratio (SNR) of the photodetectors, the use of smaller devices coupled with larger signal (due to high quantum efficiency) and lower variance (due to high response uniformity in the signal) should provide improved spatial resolution.

Further, the replacement of the photomultiplier tube with a solid state photodetector of just a few hundred microns thickness could lead to a more compact system with a significant reduction in shielding mass. For example, the lead shield 122 of the solid state gamma camera 120 is significantly smaller in size than the lead shield 102 of the PMT based gamma camera 100. The reduction in shielding mass would allow the development of lighter scintillation cameras that could be accommodated in new types of gantrys or frames. This could open up the possibility of other uses in surgeries to help locate lesion sites or in research laboratories.

Solid state photodetector signals are typically more naturally interfaced to the digital domain leading to integrated/smart detectors with much more up-front processing capability resulting in improved performance and lower cost. They are typically amenable to digital signal processing, leading to improved energy performance afforded by more optimal signal shaping such as real-time adaptive filter pulse shaping, which can optimize shaping time based on instantaneous throughput. They may also provide higher throughput due to capability of replacing analog pulse shaping with digital filters incorporating schemes such as real-time adaptive filter pulse shaping described above.

Perhaps one of the most compelling reasons for the continued development of a solid-state replacement for the PMT based cameras is the expected reduction in cost afforded by high volume planar technology silicon processing compared to expensive PMT technology. With high-volume production, some of the mentioned solid state gamma camera technologies may allow significant (e.g., 3–5 times) reduction in cost compared to PMTs, particularly given that a significant portion of the processing electronics can be integrated with the photodetectors in the case of solid-state cameras.

Although laboratory prototypes of gamma cameras based on various solid-state technologies have now become a reality, there are still major limitations based on specific problems with the detector technologies. For example, a commercial gamma camera based on arrays of Si-PIN diodes coupled to a pixelated scintillator array is available on the market today. However, price and performance of the Si-PIN based camera is still worse than those of PMT-based cameras. The segmented scintillation crystal, used to optimize the resolution, typically adds significant cost to the system.

An even greater challenge to the widespread use of the Si-PIN photodetector-based gamma cameras may be that the intrinsic detector noise is quite high for photodetectors above a few square millimeters in area. Thus the Si-PIN photodetectors are usually pixelated to just a few square mm per pixel, and each pixel typically requires a separate electronic readout channel. For example, a 25 cm by 20 cm gamma camera based on an array of 3×3 mm$^2$ pixels requires 5555 channels of readout electronics. This is a major disadvantage compared to any detector architecture that can take advantage of sparse readout schemes, such as Anger logic. Because of the large number of channels of detector and preamp/shaper, the need for multiplexers, the complexity of the readout hardware and the need for higher cost segmented scintillators, the cost of a full-size gamma camera based on Si-PIN photodetectors is typically not competitive with PMT-based systems.

Laboratory gamma cameras based on large-area silicon avalanche photodetectors (APD) have also been developed. An advantage of the APD arises because the surface leakage current of semiconductor photodetectors is significantly larger than their bulk leakage current. Typically, only the signal and the bulk leakage current component see the very high gain in the avalanche multiplication stage, while the surface leakage current, which generally dominates, is not multiplied. Thus, the APD has an improved SNR compared to a Si-PIN photodetector that has no internal gain, because all of the leakage current in such a device is typically amplified together with the signal in the external gain stage. However, avalanche structures are difficult to control in production when the diode area is large (more than a few square mm in area). For this and other reasons, the devices still are not commercially available with sufficiently large areas and they suffer from manufacturability and reliability problems, which have not been completely solved. Currently available APD's with large areas are very expensive.

Several companies and research laboratories are pursuing development of CZT-based gamma cameras. CZT is an interesting material for gamma camera construction because of its high average atomic number, which makes it highly absorbing of gamma rays, and because of its large bandgap, which gives it good spectroscopic capabilities and room temperature operation. However, despite significant progress made by these companies and research laboratories, CZT is still a very exotic material that is extremely expensive to produce and remains unproven in the commercial marketplace. Moreover, the medical applications may require performance at the limit of the capabilities of the material.

Another solid state photodetector-based gamma camera uses silicon drift photodetectors (SDPs) with an optimized entrance window for scintillation light as a direct PMT replacement. In contrast to a planar detector whose capacitance is related to the detector area, the SDP capacitance is essentially equal to the anode capacitance, which is very small (e.g., less than 100 fF (femto Farad)) because the anode is very small. For example, FIG. 2 shows a comparison between cross sections of a standard planar photodetector 150 and an SDP 160. The standard planar photodetector 150 includes an entrance electrode 152, an anode 154 and a charge amplifier 156. FIG. 2 shows that the anode 154 is similar in size to the entrance electrode 152.

The SDP 160 includes an entrance electrode 162, an anode 164, steering electrodes 166, a resistor ladder 168 for biasing the steering electrodes and a standard charge amplifier 170. Due to drift of charge carriers caused by biasing of the steering electrodes 166, the anode 164 can be significantly smaller in size than the entrance electrode 162. The SDP coupled to scintillators is disclosed in International Patent Application No. PCT/US99/26524 entitled "Gamma-Ray Detector Employing Scintillators Coupled to Semiconductor Drift Photodetectors," filed Nov. 9, 1999, the contents of which are incorporated by reference in full herein. Thus, embodiments of the present invention may employ various different methods and structures disclosed in International Patent Application No. PCT/US99/26524.

Moreover, the small detector capacitance is independent of the overall detector size. Reduction in the detector capacitance can potentially lead to significant reduction in the series noise and hence the overall detector noise. However, in order to take full advantage of the small detector capacitance, the first stage of the electronics needs to also have a similar low input capacitance and minimum stray capacitance. One way to achieve this is by integrating the first stage of the electronics, e.g., field effect transistor (FET) into the detector anode.

The integrated FET process is not compatible with high resistivity silicon detector process, typically allowing only for construction of structures with highly simplified configurations in comparison to the commercially available low noise junction FETs (JFETs). Moreover, the improvement that can be obtained with the integrated FET typically is most marked at short shaping times, which is undesirable for applications with long decay time scintillators such as CsI[Tl], which has a 1.1 $\mu$S decay time.

The standard large-area SDPs typically are cooled to approximately −30° C. ($\Delta T=50°$ C.) using thermoelectric cooling (TEC) in order to lower the leakage current sufficiently to suppress the parallel noise. Use of cooling typically requires heat transfer stages, and thus increases size and cost of gamma cameras. Thus, despite the promising results obtained with this technology to date, the practical limitations of cooling the detectors remains.

Therefore, it is desirable to develop a solid state photodetector-based gamma camera, which has advantages of both the SDP having small anode capacitance (leading to small series noise) and APD having internal gain of the detector signal and not the surface leakage current (leading to small parallel noise).

SUMMARY

In one embodiment according to the present invention, a radiation detector formed on a semiconductor material having first and second surfaces is provided. The radiation detector is used to receive radiation and to generate a detector signal. The radiation detector includes a first electrode, a second electrode and a plurality of steering electrodes. The first electrode is formed on the first surface and is used to receive the radiation. The received radiation causes mobile electrical charges to be produced in the radiation detector. The second electrode is formed on the second surface and is used to collect at least a portion of the mobile electrical charges. The second electrode is significantly smaller in size than the first electrode. The plurality of steering electrodes are formed on the second surface around the second electrode and are used to steer the mobile electrical charges towards the second electrode. The second electrode comprises an avalanche region functioning as an avalanche multiplication stage. The mobile electrical charges are multiplied in the avalanche region and collected at the second electrode.

In another embodiment of the present invention, a gamma camera comprising one or more solid state photodetectors is provided.

In yet another embodiment of the present invention, a gamma ray detector comprising one or more solid state photodetectors is provided.

In still anther embodiment of the present invention, a detector for detecting individual photons is provided. The detector includes a scintillator and an avalanche drift photodetector (ADP) optically coupled to the scintillator.

In a further embodiment of the present invention, an imaging detector for detecting individual photons is provided. The imaging detector includes a scintillator array comprising a plurality of segments and a photodetector array comprising a plurality of avalanche drift photodetectors (ADPs).

In a still further embodiment of the present invention, a detector formed on a semiconductor material is provided. The detector includes an avalanche region for multiplying a detector signal generated within the detector in response to an input stimulus. The surface of the avalanche region is substantially smaller in size than the detector surface used to receive the input stimulus. The avalanche region is used to multiply the detector signal without multiplying surface leakage current.

In a yet further embodiment of the present invention, a method of forming a solid state detector on an n-type semiconductor substrate is provided. A first part of p+ anode guard is inserted into the n-type semiconductor substrate. A first high resistivity n-type epitaxial layer is deposited on the n-type semiconductor substrate. A p+ avalanche region and a second part of p+ anode guard are inserted into the first high resistivity n-type epitaxial layer. A first n+guard is inserted into the first high resistivity n-type epitaxial layer. A second high resistivity n-type epitaxial layer is deposited on the first high resistivity n-type epitaxial layer. An n+anode and a second n+guard are inserted into the second high resistivity n-type epitaxial layer. A third part of p+ anode guard and a plurality of p+ rings are inserted into the second high resistivity n-type epitaxial layer.

In a yet further embodiment of the present invention, a method of forming a solid state detector on an n-type semiconductor substrate is provided. A first part of p+ anode guard is inserted into the semiconductor substrate. A p+ well is formed by driving p+ dopant into the n-type semiconductor substrate. A p+ avalanche region is inserted into the semiconductor substrate. A n+guard is inserted into the p+ well. The p+ well is enlarged by further driving p+ dopant into the n-type semiconductor substrate. A plurality of p+ rings are inserted into the n-type semiconductor substrate. An n+ anode is inserted into the semiconductor substrate.

BRIEF DESCRIPTION OF THE DRAWINGS

The above and other features of the present invention may be more fully understood from the following detailed description, taken together with the accompanying drawings, briefly described below, wherein similar reference characters refer to similar elements throughout and in which.

DETAILED DESCRIPTION

One embodiment of the present invention provides for a silicon avalanche drift photodetector (ADP) for applications including, but not limited to, gamma ray spectroscopy, photon counting, gamma ray counting, and gamma ray imaging. The ADP may be used to count individual gamma ray photons and to perform spectroscopy. The ADP may also be used to count light photons individually, especially when used in conjunction with scintillators with long decay times, such as, for example, CsI[Tl]. The ADP has both the small anode capacitance of an SDP and the internal gain of the detector signal (and not the surface leakage current) of an APD.

Preliminary simulations of the device structure and operation of silicon avalanche drift photodetector (ADP), and calculations of the expected parameters, such as multiplication in the avalanche region and noise performance of the device, have been performed. These simulations show the doping profile for creating the electric field distribution features necessary for the device to be operational. Specifically:

1. Electrons, created by ionization event, are focused from a large area into a small (100–200 $\mu$m diameter) anode, similar to the case of SDPs;
2. The required E-field magnitude in the avalanche region is approximately 300 kV/cm in order to allow for electron impact ionization (multiplication gain);
3. E-field magnitude has fairly uniform radial distribution within the anode region, possibly being slightly stronger near the anode center;
4. E-field magnitude everywhere else in the detector is substantially weaker, making the design robust enough where small fabrication errors and imperfections would not make the device inoperable; and 5. The doping profile may be achieved using standard planar processing techniques.

In prior detector structures, the E-field magnitude at the electrode edges tended to be orders of magnitude higher than in the regions above the electrodes. On the other hand, for the ADP in an embodiment according to the present invention, the opposite is true, i.e., the E-field above the planar anode is about two orders of magnitude higher than it is in a typical SDP, without substantially increasing the field at the anode edges.

Figure 1:
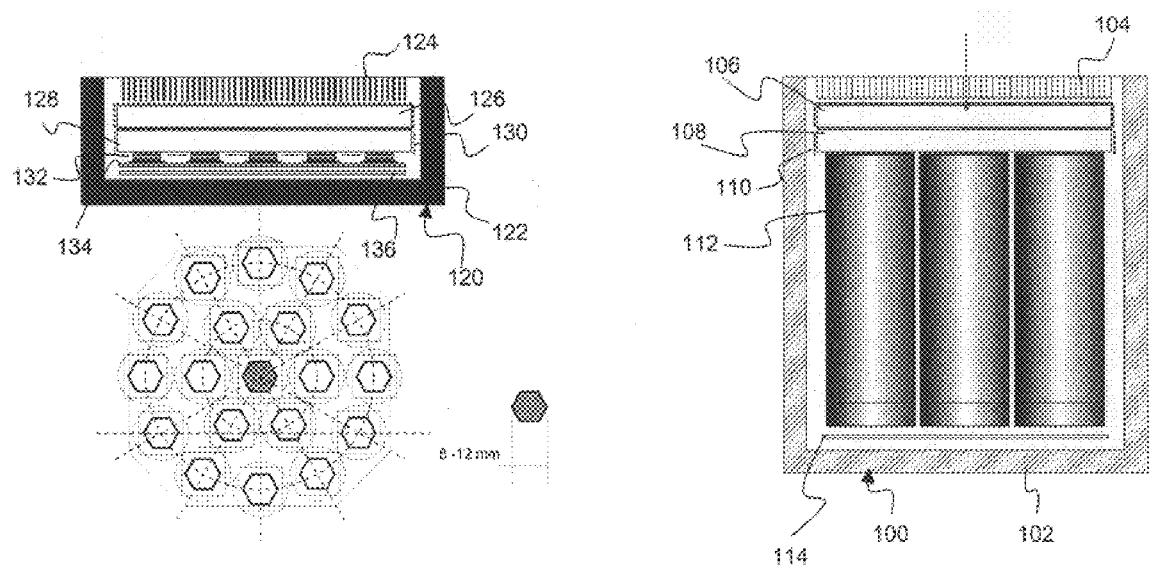
FIG. 1 shows a comparison between a standard PMT based gamma camera (right) and a solid state photodetector-based scintillation camera (left), which may incorporate an embodiment according to the present invention.
Figure 2:
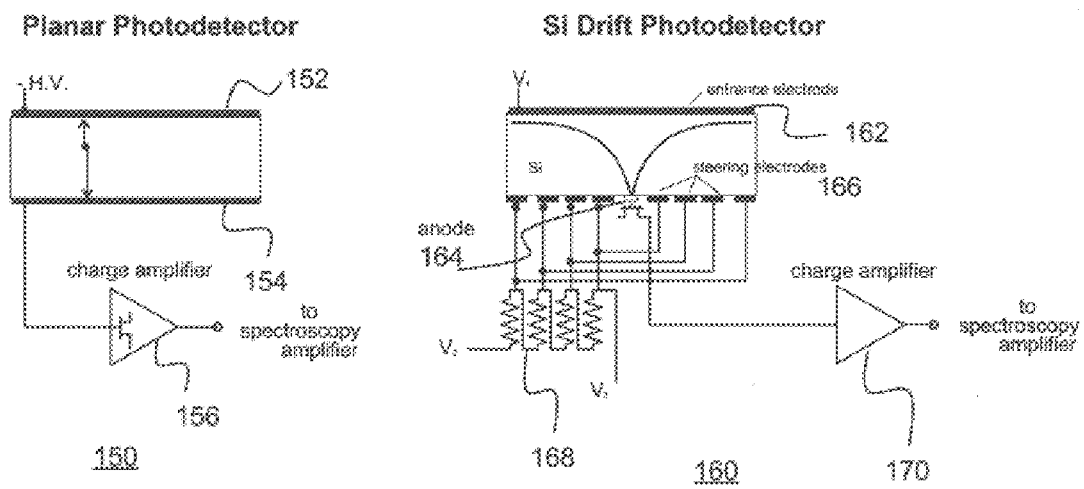
FIG. 2 shows a comparison between cross sections of standard planar diode photodetector (left) and Silicon drift photodetector (SDP) (right)
Figure 3A:
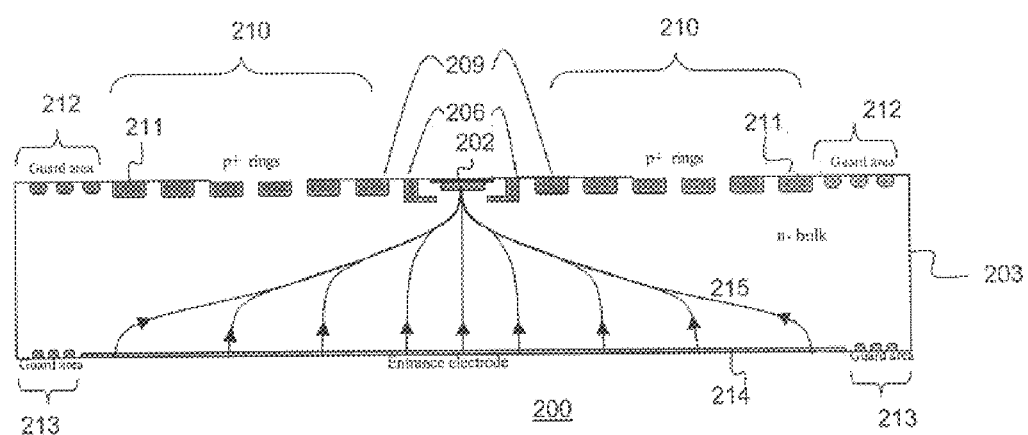
FIGS. 3A and 3B are a cross-sectional schematic views of an ADP and magnified schematic of an avalanche anode region in an embodiment according to the present invention.

The overall structure of an ADP 200, in an embodiment according to the present invention, is shown in FIG. 3A. The ADP 200 preferably is fabricated using 250–500 $\mu$m thickness, high resistivity (2–5 k$\Omega$-cm), n-type silicon wafer 203. In other embodiments, the ADP may be fabricated using an n-type or p-type silicon wafer with various different characteristics (such as, for example, resistivity and thickness).

Figure 3B:
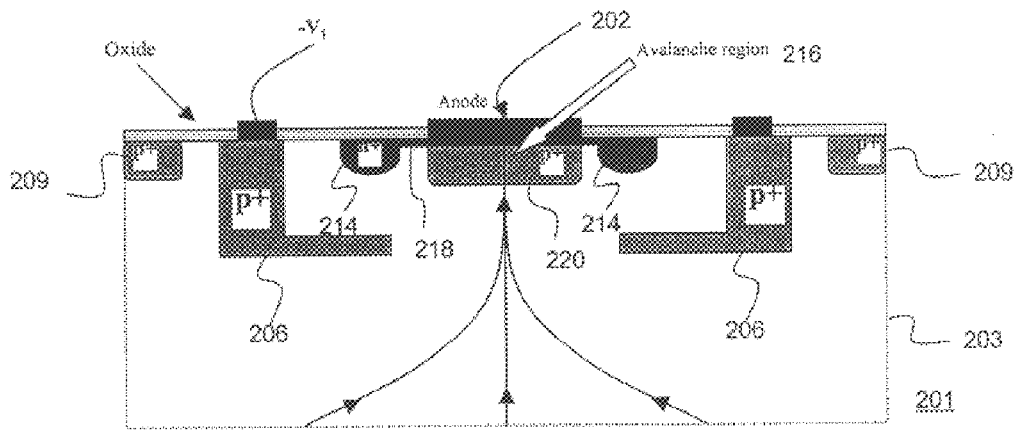

The ADP 200 incorporates a small anode 202 in a silicon drift photodetector type of structure, resulting in very small device capacitance and leading to small series noise. The ADP 200 also has internal gain of the detector signal through use of an integrated avalanche region 216 (FIG. 3B). The ADP 200 can provide low noise performance at room temperature for applications such as gamma ray spectroscopy, photon counting, gamma ray counting, and gamma ray imaging in conjunction with scintillators.

The ADP 200, as illustrated, is a cross section of a radially symmetric ADP. For example, a small anode 202 preferably is at the center of the cylindrical ADP 200, and guard rings 212 in the guard area preferably encircle the perimeter of the ADP 200 on the anode side. In other embodiments, the ADP may have a hexagonal shape with hexagonal guard structures at the perimeter of the ADP. In still other embodiments, the ADP may have other polygonal shapes.

An entrance electrode 214 preferably is formed of a thin p+ region of non-uniform radial doping concentration distribution with higher concentration in the central region and lower in the peripheral regions. Such distribution of the doping concentration has been described in commonly-owned U.S. patent application Ser. No. 09/638,738, "Semiconductor Radiation Detector," filed Aug. 13, 2000, the contents of which are incorporated by reference in full herein. Further, ADPs in one or more embodiments of the present invention may comprise radiation detector structures disclosed in the U.S. patent application No. 09/638,738.

This distribution of doping concentration may optimize the quantum efficiency for weakly penetrating photons (light and soft X-rays), since the E-field magnitude near the entrance surface of the device is highest in the anode region and lowest near the edges. The entrance electrode is preferably surrounded by a multi-ring guard structure 213 in order to prevent unwanted avalanche breakdown at the entrance electrode edges. The p+ electrode may also be uniformly doped in another embodiment of the present invention.

The anode side of the photodetector preferably contains a specially designed avalanching anode region surrounded by concentric p+ rings (drift rings) 210, which may be internally biased using internal resistor divider (not shown) formed of narrow p+ diffused lines or deposited high resistance polysilicon lines connecting one p+ ring to another. The outermost p+ ring 211 may be biased externally via bonding wires connected to an external power source. The innermost p+ ring 209 may be biased either externally, or through the above-mentioned integrated internal resistor divider.

The avalanching anode region 201, illustrated in FIG. 3B, preferably includes two electrodes: (1) an avalanching anode 202 and (2) a p+ anode guard electrode 206. The avalanching anode 202 preferably works on a similar principle as a conventional reach-through APD, the fabrication and application of which is known to those skilled in the art. The E-field magnitude preferably peaks at the metallurgical p-n junction where the avalanche multiplication of the signal preferably takes place.

When bias is applied, the p+ region 220 preferably becomes fully depleted via a punch-though effect between it and the surrounding p+ anode guard electrode 206, a description of which is provided below.

The anode 202 preferably includes a shallow circular high doping concentration n+implant 218 with deeper-driven lower concentration annular shaped n+well 214 surrounding it. The annular shaped n+well 214 may reduce the E-field magnitude at the anode edges by reducing the curvature of the n+implant.

Without it, spontaneous avalanche breakdown may occur in this region before the E-field in the desired avalanche multiplication region could be raised to the required levels. The anode 202 preferably is connected to an external second stage amplifier via a bonding wire (not shown).

The p+ anode guard electrode 206 may be used for one or more of the following without being limited to: (1) to deplete, via punch-through effect, the p+ region 220 above the anode 202 in order to create the avalanche field, as described above; (2) to control the potential drop between the anode 202 and the p+ anode guard electrode 206, thereby preferably eliminating high E-field regions which would cause unwanted avalanche breakdown at the anode periphery; and (3) to focus drifting electrons into a small area around the center of the anode 202, thus forcing them into the avalanche multiplication region and preventing them from going around it. The p+ anode guard electrode 206 preferably is biased externally, at potential $-V_1$, which preferably is negative with respect to the anode 202. By varying this bias, the avalanche E-field magnitude may be changed, thus changing the electron multiplication coefficient.

Figure 4:
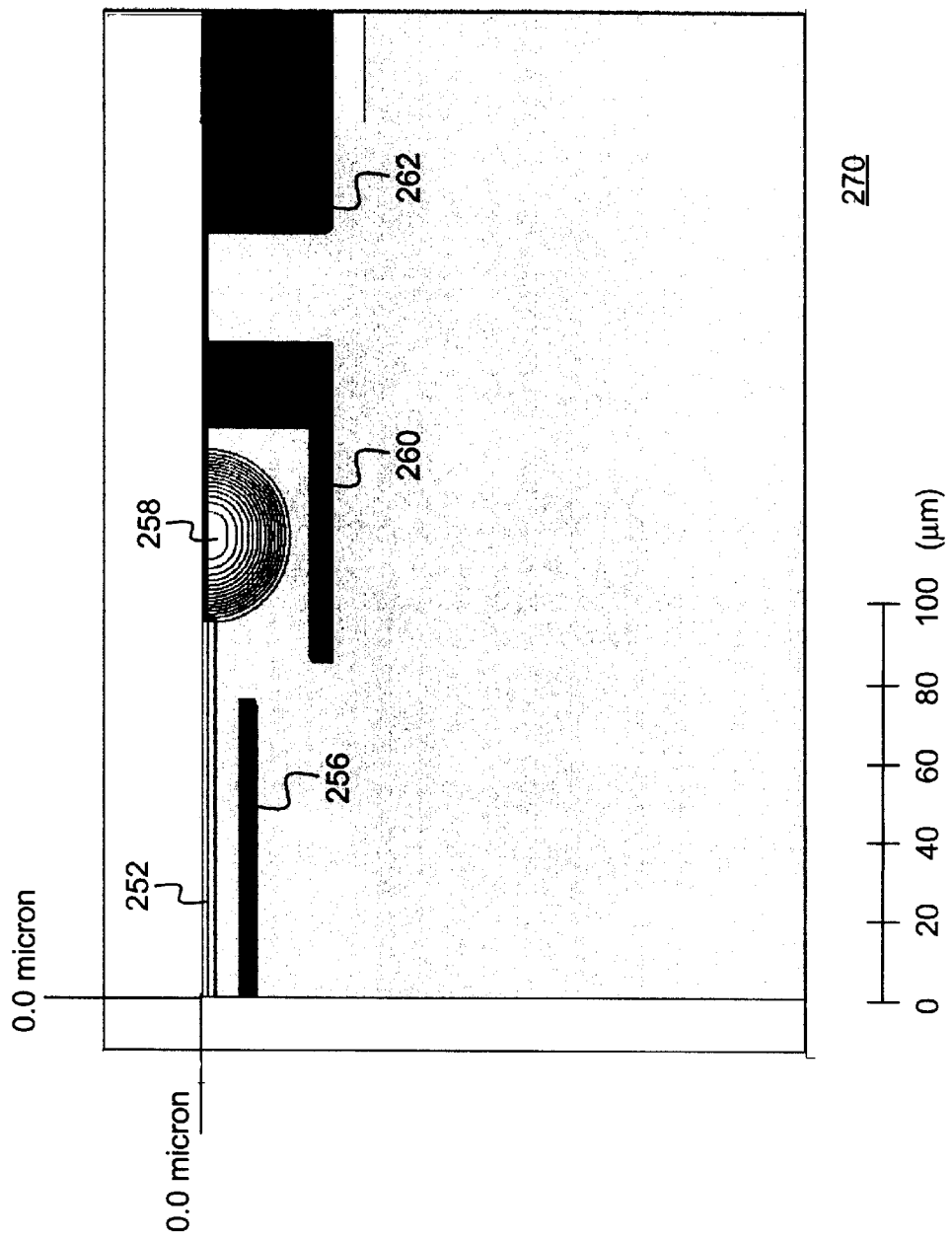
FIG. 4 illustrates a cross-sectional view of the simulated anode region dopant distribution.

FIG. 4 illustrates a simulated dopant distribution 250 in the right half of the anode region illustrated in FIG. 3B. For example, the coordinate (0.0,0.0) of the anode region illustrated in FIG. 4 corresponds to the center of the anode 202 of FIG. 3B. A doped region 252 forms the shallow circular n+ implant 218 in FIG. 3B with depth-integrated donor concentration preferably greater than approximately $2 \times 10^{12}$ cm$^{-2}$. A doped region 258 forms the annular shaped n+ well 214 in FIG. 3B preferably with a peak donor concentration of approximately $1 \times 10^{17}$ cm$^{-3}$. A doped region 256 forms the p+ region 220 of FIG. 3B preferably with a depth-integrated acceptor concentration of approximately $1.8 \times 10^{12}$ cm$^{-2}$. A doped region 260 forms the p+ anode guard electrode 206 in FIG. 3B preferably with a depth-integrated acceptor concentration greater than approximately $2 \times 10^{12}$ cm$^{-2}$. A doped region 262 represents the innermost p+ ring 209, of the set of rings 210 in FIG. 3A.

Figure 5:
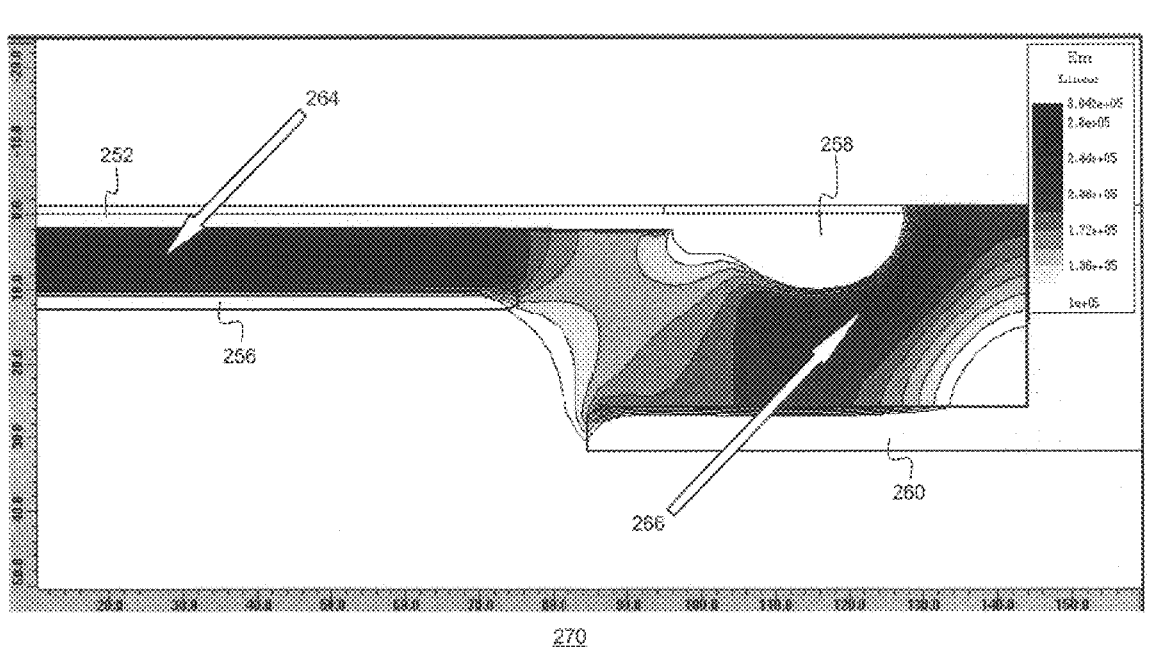
FIG. 5 illustrates a cross-sectional view of the simulated E-field magnitude distribution in the anode region.

FIG. 5 illustrates a simulated E-field magnitude distribution 270 in the vicinity of the avalanche region. E-field magnitude peaks in the central anode region 264 between the shallow circular n+ implant 252 and the p+ region 256. Another high E-field region 266 is located at the edge of the anode n+ implant. In prior art detectors, the E-field magnitude in this region is substantially higher than in the central anode region because of the curvature at the anode edge. In the embodiment of the present invention illustrated in FIG.

4, the combination of the biased anode guard electrode 260 and the annular shaped n+ well 258 preferably reduces the E-field magnitude in this region to the levels substantially below the level where the avalanche breakdown would occur.

Figure 6:
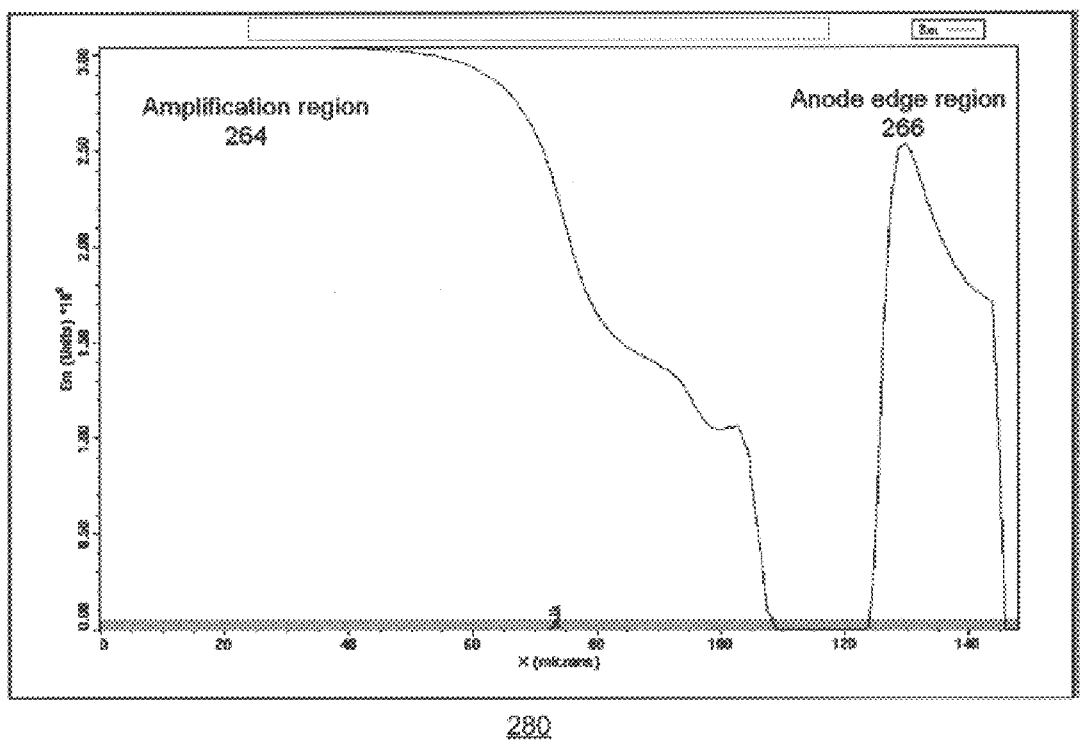
FIG. 6 illustrates a cross-sectional view of the simulated radial distribution of E-field magnitude at a few micron depth (in the middle of the avalanche region)
Figure 7:
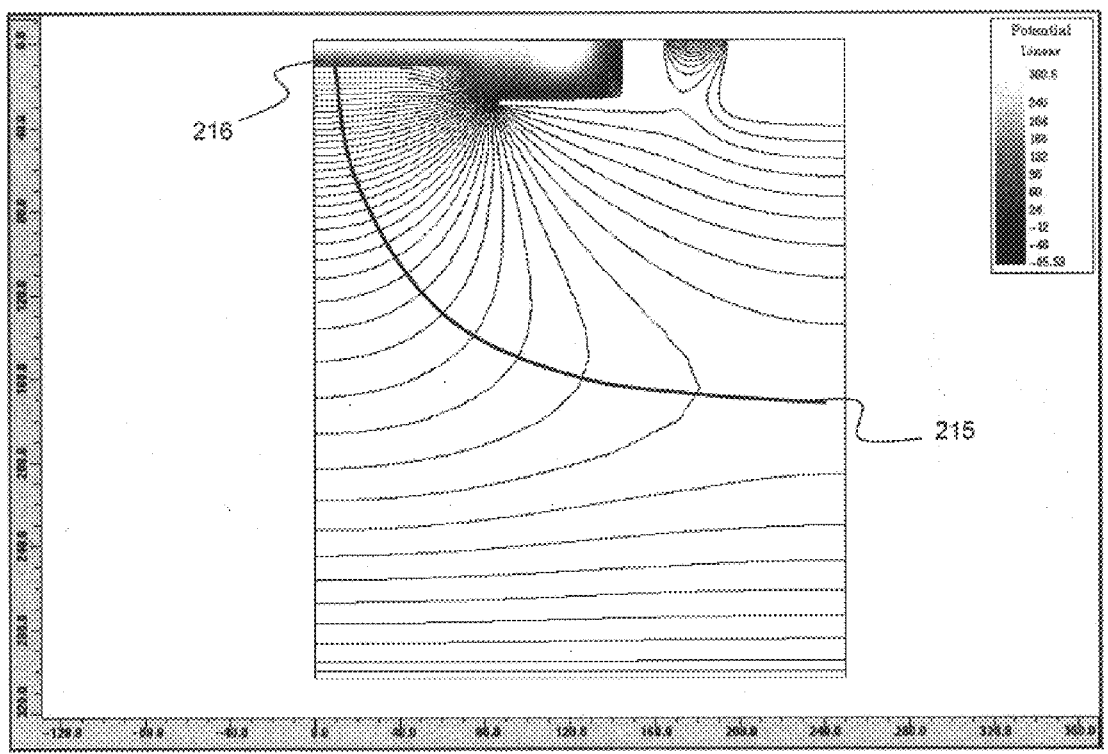
FIG. 7 illustrates a cross-sectional view of the simulated potential distribution in the anode region with electron drift trajectory.

FIG. 6 illustrates a simulated E-field magnitude 280 at three microns depth laterally from the center of the anode 202 to the inside edge of the p+ anode guard electrode 206. FIG. 7 illustrates a simulated potential distribution 290 in the anode region showing the electron drift trajectory 215 toward the avalanche region 216, between the p+ region 256 and the n+ implant 252 of FIG. 4.

As can be seen in the E-field magnitude 280 of FIG. 6, the E-field has a radial distribution, and is highly uniform inside of the anode's inner 40 $\mu$m radius, towards where almost all drifting electrons preferably are driven (see FIG. 7). This means that the amplification coefficient is very uniform throughout the whole active area of the photodetector in this embodiment of the present invention.

It should also be noted that the E-field magnitude at the anode edge (see secondary peak at ~130 $\mu$m radius in FIG. 6) is substantially lower than at the anode center (250 kV/cm and 300 kV/cm respectively). This indicates that small fabrication errors are not likely to make the anode region inoperative by causing premature avalanche breakdown at the anode edges, which means that production yield defects due to avalanche breakdown are not expected to be a problem.

Figure 8A:
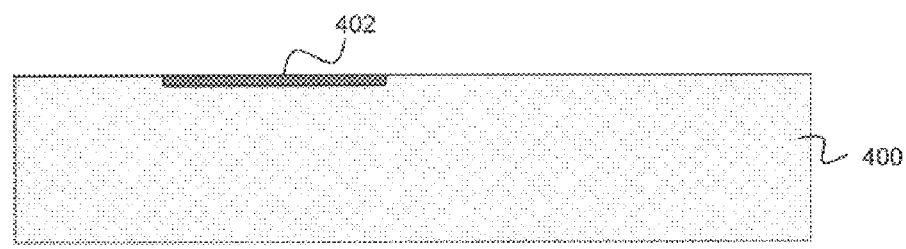
FIGS. 8A, 8B and 8C illustrate an epitaxial process for fabricating ADPs in an embodiment according to the present invention.

In an embodiment according to the present invention, a multi-step epitaxial process with generation of two epitaxial layers is used to create a dopant distribution very similar to the one shown in FIG. 4. In the first major step 450 in the flowchart in FIG. 9, as illustrated in FIG. 8A, a p+ ring 402 is diffused or implanted into a substrate material 400.

Figure 8B:
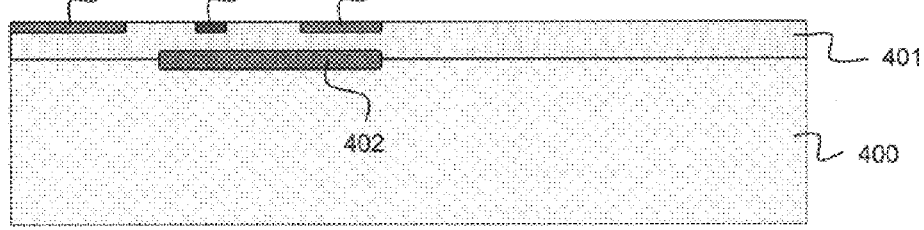
Figure 9:
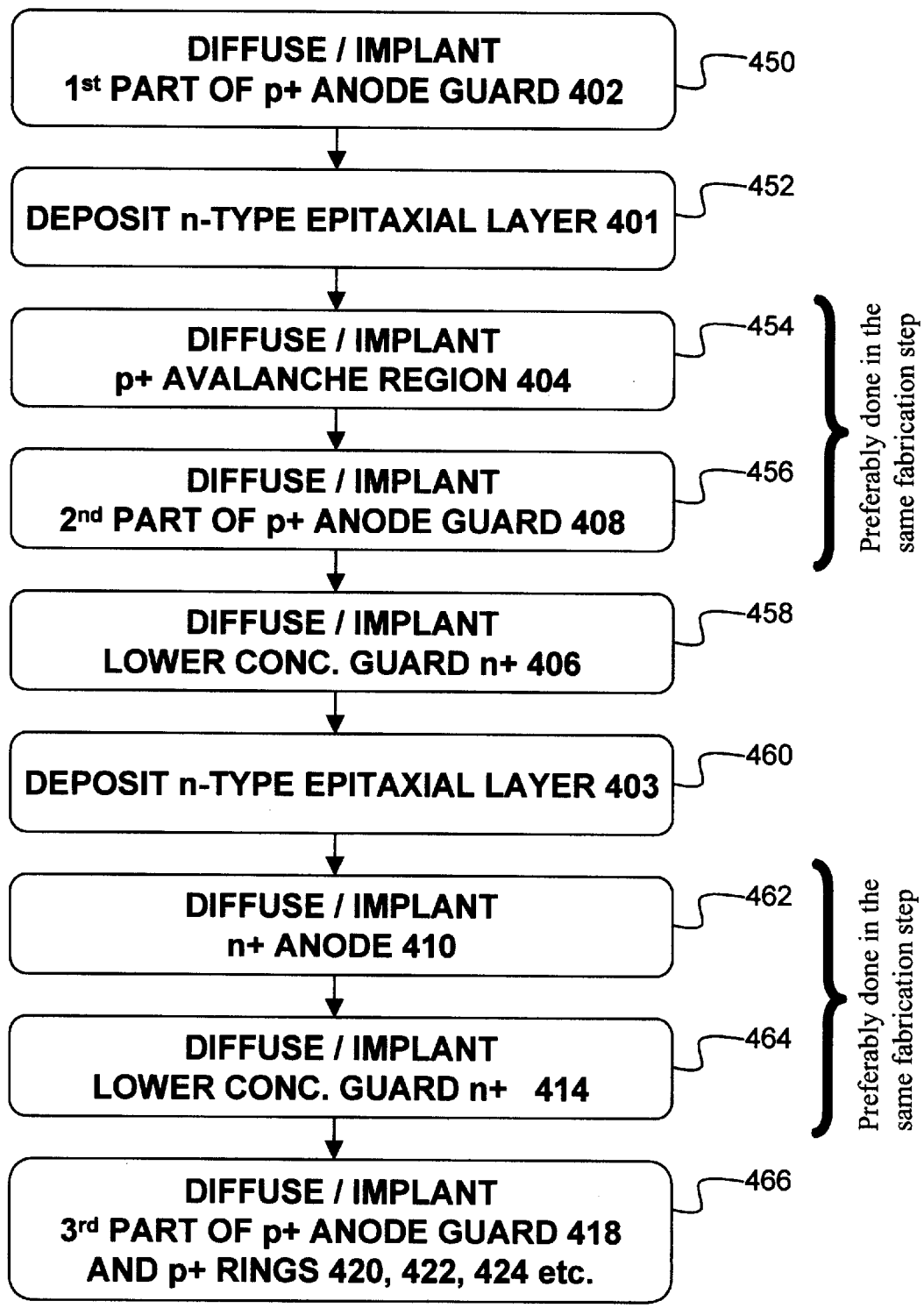
FIG. 9 is a flow diagram illustrating the epitaxial process for fabricating ADPs as illustrated in FIGS. 8A, 8B and 8C.

In the next major step 452 in FIG. 9, as illustrated in FIG. 8B, the first high resistivity n-type epitaxial layer 401 is deposited on the anode side of the substrate 400. Then, in the next steps 454, 456, 458, as illustrated further in FIG. 8B, a p+ region 404, which is a part of the reach through avalanche region, a lower concentration n+ guard region 406 and a portion of the anode guard 408 preferably are diffused or implanted into the epitaxial layer 401. As indicated in FIG. 9, steps 454 and 456 preferably are performed in the same fabrication step.

Figure 8C:
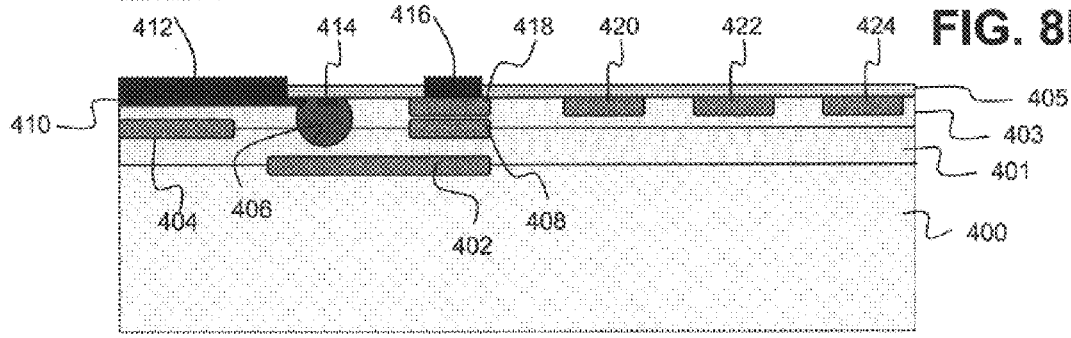

In the next step 460 in FIG. 9, as illustrated in FIG. 8C, a second high resistivity n-type epitaxial layer 403 is deposited on top of the first. Then, steps 462, 464, and 466 are performed where, as illustrated in FIG. 8C, the n+ anode 410, lower concentration n+guard region 414 and p+ rings 418, 420, 422, 424 etc. are diffused or implanted. As indicated in FIG. 9, steps 462 and 464 preferably are performed in the same fabrication step. Finally, metallic bonding pads 416 (for external bias) and 412 (for signal readout) are deposited on the innermost p+ ring 418 and the anode 410, respectively.

Figure 10A:
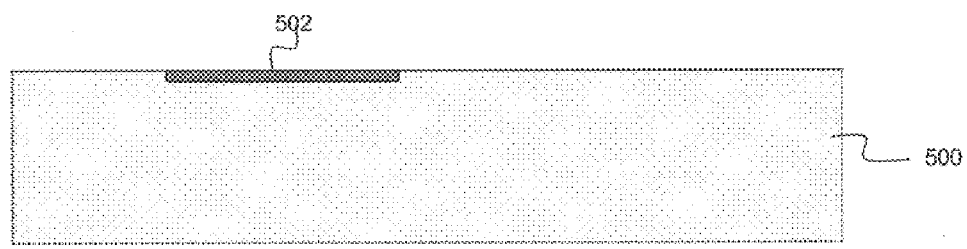
FIGS. 10A, 10B and 10C illustrate a diffusive process for fabricating ADPs in another embodiment according to the present invention.
Figure 10B:
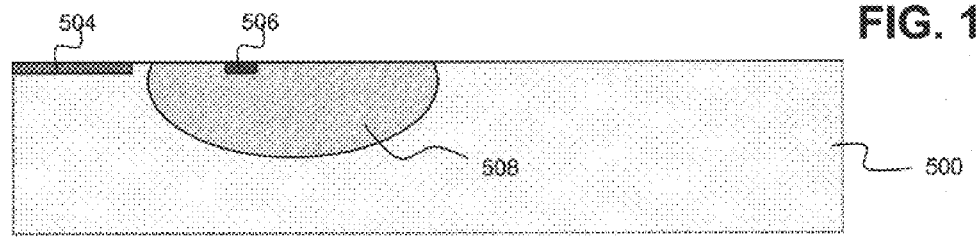
Figure 10C:
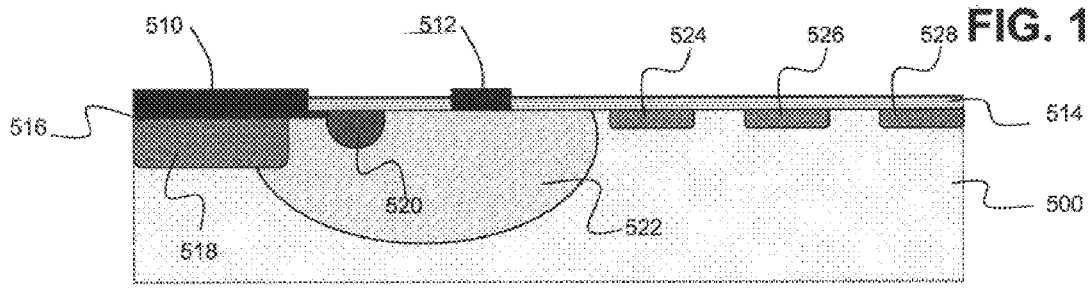

In another embodiment according to the present invention illustrated in FIGS. 10A, 10B, 10C, deep dopant diffusions are used instead of epitaxial layers. First, as illustrated in FIG. 10A, a p+ ring 502 is diffused or implanted into a silicon substrate 500 in step 550 of FIG. 11. Next, the p+ dopant is driven into the substrate 500 to form a large and deep well 508, as illustrated in FIG. 10B, in step 552 of FIG. 11.

Figure 11:
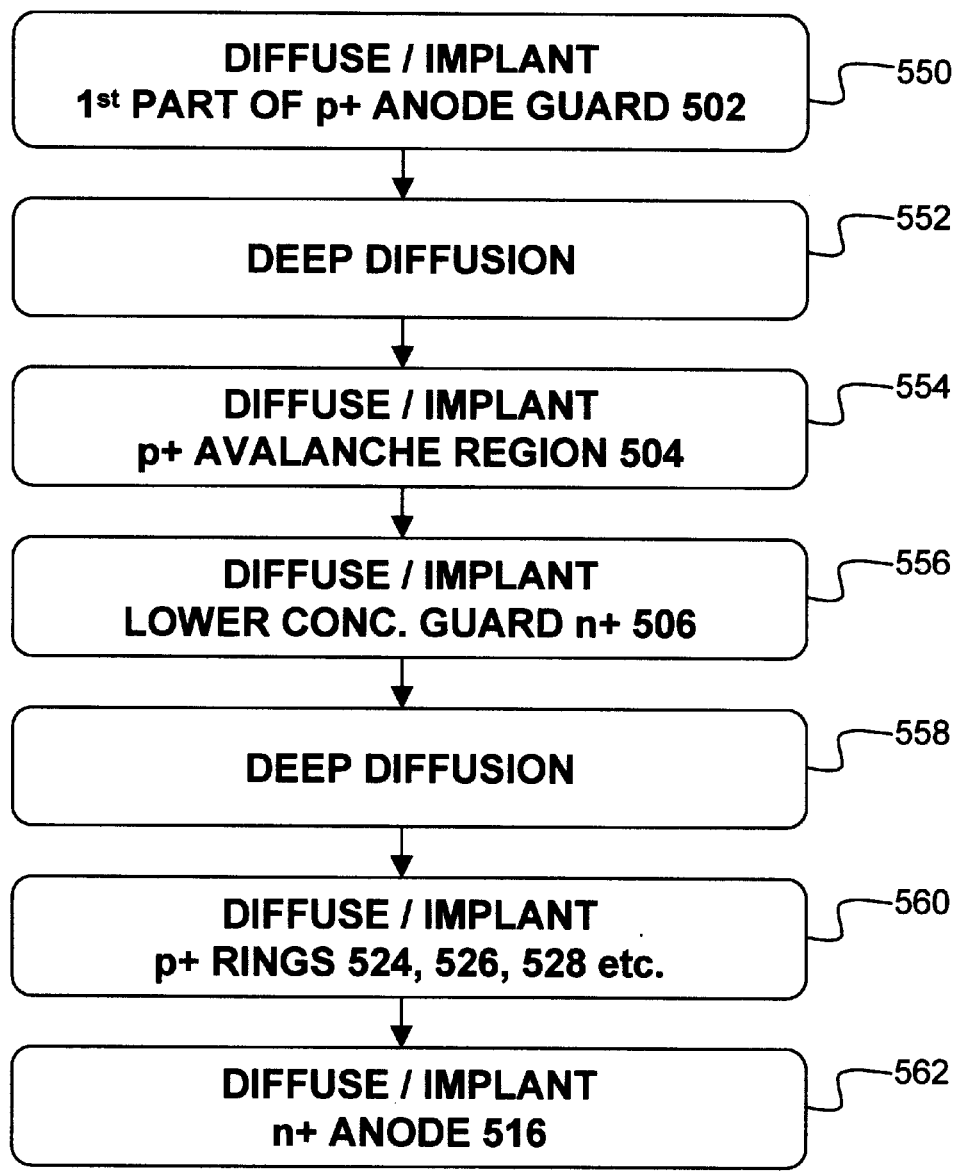
FIG. 11 is a flow diagram illustrating the diffusive process for fabricating ADPs as illustrated in FIGS. 10A, 10B and 10C.

Next, the p+ anode region 504, which is part of the reach through avalanche region, and the lower concentration n+ guard region 506, as illustrated in FIG. 10B, are diffused or implanted in steps 554, 556 of FIG. 11.

Next, these regions are driven into the silicon substrate 500 to form the anode region p-well 518 and the lower concentration n+ guard region 520. Thereafter, the remaining p+ regions for the biasing rings 524, 526, 528, etc. and n+ anode region 516 are implanted or diffused in steps 560 and 562 respectively. Finally, metallized contacts 510 and 512 are made for the anode and the guard, respectively.

This method is simpler and cheaper to implement than the first described embodiment, since it allows the device to be fabricated without epitaxial processes, which are more expensive. Also, the silicon lattice, formed by the method of FIG. 8, may produce more defects than native lattice, which could increase thermally generated bulk leakage current resulting in a lower signal to noise ratio for the epitaxially grown device as compared with the device fabricated without epitaxial processes.

The ADP, in an embodiment according to the present invention, may be used as a photomultiplier tube replacement in conjunction with a scintillator for construction of a gamma ray detector exhibiting 1) excellent energy resolution; and 2) operation at or near room temperature. It may also be used as a photomultiplier tube replacement in conjunction with a scintillator for construction of a solid state Anger camera exhibiting: 1) excellent energy resolution; 2) excellent spatial resolution, operating at or near room temperature; and 3) be amenable to construction of large detector with significantly less electronic channels than similar sized systems based on Si-PIN or CZT detectors.

The solid state photodetector-based gamma camera with ADP may be referred to as an ADP-based gamma camera or as an avalanche drift gamma camera. The avalanche drift gamma camera incorporates an avalanche multiplication gain stage into the detector anode of an SDP structure in order to extend the performance and to obtain improved performance at longer shaping times without requiring significant cooling.

The integration of the avalanche multiplication stage into the SDP anode has many advantages over the integration of an FET structure on unity gain detectors. The integrated FET process is typically not compatible with high resistivity silicon detector process, allowing only for construction of structures with highly simplified configurations in comparison to the commercially available low noise JFETs. On the other hand, the avalanche structure may use a planar fabrication process compatible with SDP fabrication with the addition of only, for example, 2 or 3 masks.

Moreover, high gain may be achieved in an avalanche process, but it is often difficult to achieve good transconductance (above fraction of mS) in an integrated FET that is restricted to the small size and low capacitance (e.g., less than 100 fF) comparable to the SDP anode capacitance. The avalanche structure also generally requires fewer interconnections with the external electronics and the interconnections are typically less susceptible to noise due to already large amplified signal at the interconnections.

Compared to large area avalanche detectors, because the amplification region is a small fraction (e.g., less than 0.01%) of the detector area (e.g., area of amplification region is only $8\times10^{-5}$ cm$^2$ vs 0.5 cm$^2$ for the area of detector), the signal amplification coefficient for the structure of the present invention is essentially independent of interaction location in the detector, and so the gain may be much more uniform than in a standard APD of the same area. The extremely small avalanche region size (e.g., $8\times10^{-3}$ mm$^2$) also means that the process may be much more reliable than it is for even small commercial APDs of just a few mm$^2$ area. In other embodiments, the size of the avalanche region and the detector area may vary, but the size of the avalanche region is still a small fraction of the detector area.

Figure 12:
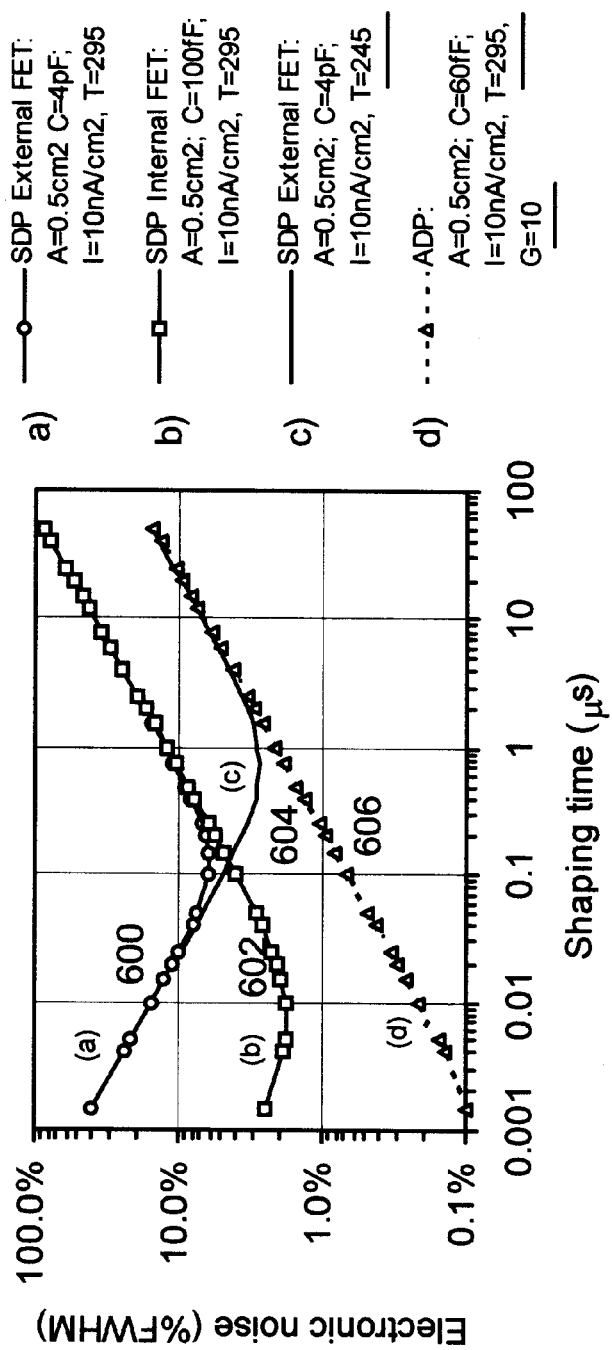
FIG. 12 is a graph of calculated electronic noise ($\Delta E/E$ [% FWHM]) vs. peaking time for 140 keV photons for the following four scenarios:
(a) 0.5 $cm^2$ SDP coupled to CsI(Tl) with an external FET operated at room temperature;
(b) 0.5 $cm^2$ SDP coupled to CsI(Tl) with an integrated FET operated at room temperature;
(c) 0.5 $cm^2$ SDP coupled to CsI(Tl) with an external FET operated at −28° C. and
(d) 0.5 $cm^2$ avalanche drift photodetector (ADP) coupled to CsI(Tl) operated at room temperature.

FIG. 12 is a graph of calculated photopeak broadening ($\Delta E/E$ [% FWHM]) vs. peaking time for 140 keV photons for four different photodetectors: (a) a 0.5 cm$^2$ SDP coupled to CsI[Tl] and operated at room temperature (T=295K) with external FET as represented by line 600, (b) a 0.5 cm$^2$ SDP coupled to CsI[Tl] and operated at room temperature (T=295K) with integrated FET as represented by line 602. Note that the series noise asymptote moves to the lower left due to the decreased capacitance of the internal FET relative to the external FET, (c). a 0.5 cm$^2$ SDP coupled to CsI(Tl) with external FET and operated at −28.15° C. (T=245 K) to reduce the leakage current as represented by line 604. Note that the parallel noise asymptote moves to the lower right due to the decreased leakage obtained by cooling the detector, and (d) the 0.5 cm$^2$ ADP of the current invention operated at room temperature (T=295K) as represented by line 606. Note that the parallel noise asymptote moves to the lower right due to the decreased effect of the leakage current obtained by the internal multiplication gain, and the series noise asymptote moves to the lower left due to the decreased capacitance obtained by integrating the multiplication gain into the anode.

The noise calculations represented by the graphs of FIG. 12 include three dominant noise sources, namely: the electronic noise, the intrinsic noise of the scintillator, and the statistical noise.

The electronic noise resolution has been calculated using an electronic noise model described by J. S. Iwanczyk and B. E. Patt in "Low Noise Electronics for X-Ray and Gamma Ray Spectrometry", chapter 14 in Semiconductor for Room Temperature Nuclear Detector Applications, MRS Volume #43 for Semiconductors and Semimetals Series, editors: Schlesinger, T. E., and James R. B., Academic Press.(1995), which is hereby incorporated by reference in full, using the following assumptions:

For the SDP, it was assumed that detector leakage current $I_D$ is 10 nA/cm$^2$ (at 295K), operating temperature is either 295K, or 248K for the different cases, FET gate current $I_g$ is 0.2 pA, detector parallel resistance $R_p$ is 10$^{15}$, and detector series noise resistance $R_{sd}$ is 1 $\Omega$. Detector capacitance $C_d$ for the SDP was assumed to be 60 fF, and input capacitance (stray plus FET input capacitance) $C_{in}$ was assumed to be 100 fF for the integrated FET and 4 pF for the external FET cases, respectively.

Mean energy to create an electron hole pair, w, was assumed to be 3.6 eV (Si). Transconductance $g_m$ was assumed to be 5 mS for external FET and 1.0 mS for integrated FET, and FET series noise resistance $R_s$ was assumed to be 0.67/$g_m$. A value of approximately 140 eV FWHM was used for the excess 1/f noise due to the FET and surrounding structures, the generation-recombination noise was ignored, and triangular shaping was assumed.

For the ADP, the effect of the gain on the noise performance of the device should also be considered. In this case, the model referred to above was modified as follows:

$$\Delta E_n = 2.355 \frac{w}{e} \left\{ \left[ eI'_L + eI_B M^2 F + \frac{2kT}{R'_p} \right] \right.$$

$$\left. N_p^2 \langle + 2kTR'_s C_{in}^2 \rangle N_s^2 \langle + A_{1/f} \rangle N_{1/f}^2 \langle + BC_{in}^2 \rangle N_{g-r}^2 \right\}^{\frac{1}{2}}$$

where the bulk current in the detector $I_B$ was 300 pA, avalanche multiplication M was 16, and avalanche diode noise factor F was 2. In order to collect all of the scintillation light one should match the amplifier shaping time with the scintillator decay constant (1.1 $\mu$s for CsI[Tl] as described in PCT/US99/26524. Thus shaping times of 4–12 $\mu$s should be used for CsI(Tl).

Considering only the electronic noise for the moment, the electronic noise is 29% FWHM relative to the 140 keV signal for a standard SDP at room temperature. The electronic noise may be lowered to less than 5.5% by either cooling of $\Delta T=50°$ or by the proposed new ADP structure, operating at room temperature.

For example, incorporation of multiplication gain of 10 into the SDP to fabricate the ADP in an embodiment according to the present invention, can reduce the noise at shaping times above 2 $\mu$s as much as cooling a standard SDP to 248K. Even better noise performance may be obtained at very short shaping times, making the avalanche drift photodetector useful with faster scintillators such as Sodium Iodide (NaI(Tl)) or Lutetium Orthosilicate (LSO).

Photopeak broadening due to electronic noise of 2–8% is possible in the 1–10 $\mu$s shaping time range for the ADP of the present invention, so that overall energy resolution of <10% FWHM at 140 keV is possible in a scintillation-camera based on ADP in an embodiment according to the present invention.

Whereas the electronic noise described above is independent of the energy of incident gamma ray photons, this energy does affect the intrinsic scintillator noise and the statistical noise.

The scintillator noise is dependent mainly on the scintillation light yield of the particular scintillator, the geometry of the scintillator and preparation of its surfaces, the coupling between the scintillator and the photodetector, and the quantum efficiency of the photodetector. The intrinsic scintillator noise, is known empirically to be approximately 3–5% FWHM at 140 keV. Thus we have used a value of 4% for the scintillator noise in the calculations used to derive the graphs in FIG. 12.

Assuming that a yield of 4,000 photons results at 140 keV, the statistical noise contribution, associated with the number of e-h pairs produced in the SDP for each 140 keV gamma ray, is approximately 3.7% FWHM at 140 keV.

Taking into account the electronic noise as well as statistical noise contribution of approximately 3.7% FWHM, and approximately 4% FWHM intrinsic resolution of the scintillator, overall broadening of the 140 keV photo peak is expected to be approximately 31% FWHM for the 0.5 cm2 SDPs using either internal or external gain at room temperature because the parallel noise dominates over the series noise as can be seen when lines 600 and 602 of the graph in the FIG. 12 are compared. This may be improved to about 7.5% by cooling the SDP by 50° C. However, this does not take into account the loss of signal due to approximately 0.5% per degree Celsius coefficient of light loss in CsI[Tl] that applies when the scintillator is cooled. The overall broadening of the photopeaks for the scintillator, coupled ADP of the present invention, may be about 7.5% FWHM at 140 keV at room temperature.

CsI(Tl) is one of the best suited scintillators for coupling to silicon photodetectors due to the good spectral match between the scintillator light production and the photodetector spectral response. On the other hand, CsI(Tl) has a long decay time (e.g., greater than 1 $\mu$s), necessitating a long shaping time (6–10 $\mu$s) in the amplifier in order to collect all of the scintillation light. Because of this, there usually is no advantage to using an integrated FET over a low capacitance external FET, optimally coupled to the detector, as the electronic noise is dominated by the leakage current and not by the capacitance, for shaping times greater than about 0.5 $\mu$s, as shown in FIG. 12. For example, after the shaping time of about 0.5 $\mu$s, as illustrated in FIG. 12, line 600, representing electronic noise for an SDP with external FET, and line 602, representing electronic noise for an SDP with integrated FET, substantially overlap.

Room temperature operation allows elimination of heat transfer stages, reducing the mass surrounding the detector, and hence the scatter, and allows for less complicated and less costly instruments in general. Sources of scatter include Compton scatter in the various media in and around the patient, scatter from the camera body, the aperture (collimator), other parts of the imaging system, and scatter within the detector (including scintillator and photodetector). Other sources of anomalous radiation include emission of X-ray fluorescent radiation (such as escape X-rays) from the materials in the collimator, scintillator and photodetector. Each of these can significantly degrade the image. It also reduces the cost of the front-end electronics. For example, to achieve the best SDP performance with an external FET, very expensive (>$300) commercial FETs are generally required. Less complicated and less costly technology lends itself to easier adaptation to large-area arrays as required to assemble an anger camera.

Having now described the invention in accordance with the requirements of the patent statutes, those skilled in this art will understand how to make changes and modifications in the present invention to meet their specific requirements or conditions. Such changes and modifications may be made without departing from the scope and spirit of the invention as set forth in the following claims.

For example, although the example discussed here is the case of an ADP with an n-type bulk, with multiple p+ electrodes (p+ cathodes) surrounding the n+ anode (detector anode), and with a p+ entrance window, in other embodiments, devices with reverse type doping regions may be fabricated. In other words, the embodiments described herein may also be produced with a p-type bulk, multiple n+ electrodes surrounding a p+ anode and an n+ entrance window.

We claim:

1. A radiation detector formed on a semiconductor material having first and second surfaces, the radiation detector being used to receive radiation and to generate a detector signal, the radiation detector comprising:
   a first electrode formed on the first surface, the first electrode being used to receive the radiation, the received radiation causing mobile electrical charges to be produced in the radiation detector;
   a second electrode formed on the second surface, the second electrode being used to collect at least a portion of the mobile electrical charges, the second electrode being significantly smaller in size than the first electrode; and
   a plurality of steering electrodes formed on the second surface around the second electrode and a guard electrode, the steering electrodes being used to steer the mobile electrical charges towards the second electrode,
   wherein the second electrode is adjacent to an avalanche region functioning as an avalanche multiplication stage, and the mobile electrical charges are multiplied in the avalanche region and collected at the second electrode.

2. The radiation detector according to claim 1, wherein the steering electrodes, the first electrode and the second electrode are biased to generate an electric field, which is used to steer the mobile electrical charges towards the second electrode.

3. The radiation detector according to claim 1, the radiation detector further comprising a field effect transistor (FET) formed on the semiconductor material and coupled to the second electrode.

4. The radiation detector according to claim 1, wherein the shape of the first electrode, the second electrode and the steering electrodes includes one selected from a group consisting of circle, square and hexagon.

5. The radiation detector according to claim 1, wherein the first electrode, the second electrode and the steering electrodes have a polygonal shape.

6. The radiation detector according to claim 1, wherein the second electrode further comprises a shallow doped implant and a deeper-driven annular shaped doped well surrounding it, wherein the doping concentration of the shallow doped implant is higher than the doping concentration of the annular shaped well.

7. The radiation detector according to claim 6, wherein the radiation detector further comprises a guard electrode surrounding the second electrode, the guard electrode being used to deplete the avalanche p+ region, thereby allowing an avalanche field to exist in the avalanche p+ region.

8. The radiation detector according to claim 1, wherein the semiconductor material comprises n-type silicon, the first electrode comprises p+ region, the second electrode comprises n+ region and an avalanche p+ region, and the steering electrodes comprise p+ regions,
   wherein the avalanche region comprises p-n junction between the n+ region and the avalanche p+ region, and
   wherein the distance between the p+ avalanche region and the first electrode is less than the distance between the n+ region and the first electrode.

9. The radiation detector according to claim 8, the radiation detector further comprising a plurality of n+ inserts, wherein each n+ insert separates two adjacent steering electrodes from one another.

10. The radiation detector according to claim 9, wherein the plurality of n+ inserts are floating.

11. The radiation detector according to claim 9, wherein the plurality of n+ inserts are biased.

12. The radiation detector according to claim 1, wherein the first electrode is segmented through doping with variable doping concentrations.

13. The radiation detector according to claim 12, wherein the first electrode is segmented such that portions of the first electrode that are radially equidistant from the center of the first electrode are doped with substantially the same doping concentration.

14. The radiation detector according to claim 1, wherein the semiconductor material comprises p-type silicon, the first electrode comprises n+ region, the second electrode comprises p+ region and an avalanche n+ region, and the steering electrodes comprise n+ regions,
   wherein the avalanche region comprises p-n junction between the p+ region and the avalanche n+ region, and
   wherein the distance between the n+ avalanche region and the first electrode is less than the distance between the p+ region and the first electrode.

15. The radiation detector according to claim 14, the radiation further comprising a plurality of p+ inserts, wherein each p+ insert separates two adjacent steering electrodes from one another.

16. The radiation detector according to claim 15, wherein the plurality of p+ inserts are floating.

17. The radiation detector according to claim 15, wherein the plurality of p+ inserts are biased.

18. The radiation detector according to claim 1, wherein the first electrode is physically segmented by inserting separation regions between the segments.

19. The radiation detector according to claim 18, wherein the segments are biased differently from one another.

20. The radiation detector according to claim 19, wherein the separation regions are biased differently from one another.

21. A gamma camera comprising one or more solid state photodetectors, wherein at least one solid state photodetector is formed on a semiconductor material having first and second surfaces, said at least one solid state photodetector being used to receive radiation and to generate a detector signal, said at least one solid state photodetector comprising:
   a first electrode formed on the first surface, the first electrode being used to receive the radiation, the received radiation causing mobile electrical charges to be produced in the radiation detector;
   a second electrode formed on the second surface, the second electrode being used to collect at least a portion of the mobile electrical charges, the second electrode being significantly smaller in size than the first electrode; and
   a plurality of steering electrodes formed on the second surface around the second electrode and a guard electrode the steering electrodes being used to steer the mobile electrical charges towards the second electrode,
   wherein the second electrode is adjacent to an avalanche region functioning as an avalanche multiplication stage, and the mobile electrical charges are multiplied in the avalanche region and collected at the second electrode.

22. The gamma camera of claim 21, the gamma camera further comprising a scintillator for receiving gamma ray, wherein the scintillator generates the radiation using the gamma ray and provides the radiation to the solid state photodetector.

23. The gamma camera of claim 21, wherein the gamma camera comprises an array of solid state photodetectors formed on a same monolithic bulk of semiconductor material.

24. A gamma ray detector comprising one or more solid state photodetectors, wherein at least one solid state photodetector is formed on a semiconductor material having first and second surfaces, said at least one solid state photodetector being used to receive radiation and to generate a detector signal, said at least one solid state photodetector comprising:
   a first electrode formed on the first surface, the first electrode being used to receive the radiation, the received radiation causing mobile electrical charges to be produced in the radiation detector;
   a second electrode formed on the second surface, the second electrode being used to collect at least a portion of the mobile electrical charges, the second electrode being significantly smaller in size than the first electrode; and
   a plurality of steering electrodes formed on the second surface around the second electrode and a guard electrode the steering electrodes being used to steer the mobile electrical charges towards the second electrode,
   wherein the second electrode is adjacent to an avalanche region functioning as an avalanche multiplication stage, and the mobile electrical charges are multiplied in the avalanche region and collected at the second electrode.

25. The gamma ray detector of claim 24, wherein the gamma ray detector comprises an array of solid state photodetectors formed on a same monolithic bulk of semiconductor material.

26. The gamma ray detector of claim 24, the gamma ray detector further comprising a scintillator for receiving gamma ray, wherein the scintillator generates the radiation using the gamma ray and provides the radiation to the solid state photodetector.

27. The gamma ray detector of claim 26, wherein the radiation comprises photons and the detector signal is used to count individual photons generated by the scintillator.

28. The gamma ray detector of claim 26, wherein the gamma ray detector is used for gamma ray spectroscopy.

29. The gamma ray detector of claim 26, wherein the gamma ray detector is used for gamma ray counting.

30. A detector for detecting individual photons, the detector comprising:
   a scintillator; and
   a radiation detector optically coupled to the scintillator, said radiation detector comprising:
      a first electrode formed on the first surface, the first electrode being used to receive the radiation, the received radiation causing mobile electrical charges to be produced in the radiation detector;
      a second electrode formed on the second surface, the second electrode being used to collect at least a portion of the mobile electrical charges, the second electrode being significantly smaller in size than the first electrode; and
      a plurality of steering electrodes formed on the second surface around the second electrode and a guard electrode the steering electrodes being used to steer the mobile electrical charges towards the second electrode,
      wherein the second electrode is adjacent to an avalanche region functioning as an avalanche multiplication stage, and the mobile electrical charges are multiplied in the avalanche region and collected at the second electrode.

31. The detector according to claim 30 wherein the radiation detector has dimensions and an electric field distribution creating a time spread of a signal generated in the radiation detector substantially matching a decay time of the scintillator.

32. An imaging detector for detecting individual photons, the imaging detector comprising:
   a scintillator array comprising a plurality of segments; and
   a photodetector array comprising a plurality of radiation detectors, each radiation detector comprising:
      a first electrode formed on the first surface, the first electrode being used to receive the radiation, the received radiation causing mobile electrical charges to be produced in the radiation detector;
      a second electrode formed on the second surface, the second electrode being used to collect at least a portion of the mobile electrical charges, the second electrode being significantly smaller in size than the first electrode; and
      a plurality of steering electrodes formed on the second surface around the second electrode, the steering electrodes being used to steer the mobile electrical charges towards the second electrode,
      wherein the second electrode comprises an avalanche region functioning as an avalanche multiplication stage, and the mobile electrical charges are multiplied in the avalanche region and collected at the second electrode.

33. The imaging detector according to claim 32, wherein the radiation detectors have dimensions and electric field distributions creating a time spread of signals generated in the radiation detectors substantially matching the decay time of the segments.

* * * * *